(12) United States Patent
Kasuya

(10) Patent No.: US 11,096,282 B2
(45) Date of Patent: Aug. 17, 2021

(54) SUBSTRATE BONDING STRUCTURE

(71) Applicant: Murata Manufacturing Co., Ltd., Nagaokakyo (JP)

(72) Inventor: Atsushi Kasuya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/076,844

(22) Filed: Oct. 22, 2020

(65) Prior Publication Data
US 2021/0045245 A1 Feb. 11, 2021

Related U.S. Application Data

(63) Continuation of application No. PCT/JP2019/019609, filed on May 17, 2019.

(30) Foreign Application Priority Data

May 21, 2018 (JP) .............................. JP2018-097085

(51) Int. Cl.
*H05K 1/02* (2006.01)
*H05K 1/14* (2006.01)
(Continued)

(52) U.S. Cl.
CPC .......... *H05K 1/144* (2013.01); *H05K 1/0271* (2013.01); *H05K 1/113* (2013.01); *H05K 3/0035* (2013.01); *H05K 3/0038* (2013.01); *H05K 3/0047* (2013.01); *H05K 3/368* (2013.01); *H05K 3/421* (2013.01); *H05K 3/429* (2013.01); *H05K 2201/0141* (2013.01); *H05K 2201/041* (2013.01); *H05K 2201/09509* (2013.01); *H05K 2201/09563* (2013.01); *H05K 2201/09609* (2013.01); *H05K 2201/09827* (2013.01);
(Continued)

(58) Field of Classification Search
CPC ....... H05K 1/0271; H05K 1/113; H05K 1/144
See application file for complete search history.

(56) References Cited

U.S. PATENT DOCUMENTS

2004/0156583 A1 8/2004 Totani et al.

FOREIGN PATENT DOCUMENTS

JP 05-15466 U 2/1993
JP 08-51279 A 2/1996
(Continued)

OTHER PUBLICATIONS

Official Communication issued in International Patent Application No. PCT/JP2019/019609, dated Jul. 16, 2019.

*Primary Examiner* — Jeremy C Norris
(74) *Attorney, Agent, or Firm* — Keating & Bennett, LLP

(57) ABSTRACT

A substrate bonding structure includes a first substrate including a first resin substrate that melts by heating, a second substrate having a second resin substrate that melts by heating, and an overlapping portion with the first substrate. The overlapping portion between the first substrate and the second substrate includes a hole continuously extending from the first substrate to the second substrate. The first substrate includes a melted portion of the first resin substrate around the hole, and the second substrate includes a melted portion of the second resin substrate around the hole. The first substrate and the second substrate are bonded to each other with a fused portion between the melted portion of the first resin substrate and the melted of the second resin substrate.

19 Claims, 14 Drawing Sheets

(51) Int. Cl.
  *H05K 1/11*   (2006.01)
  *H05K 3/00*   (2006.01)
  *H05K 3/36*   (2006.01)
  *H05K 3/42*   (2006.01)

(52) U.S. Cl.
  CPC . *H05K 2203/061* (2013.01); *H05K 2203/065* (2013.01); *H05K 2203/1484* (2013.01)

(56) References Cited

FOREIGN PATENT DOCUMENTS

| | | |
|---|---|---|
| JP | 2005-246704 A | 9/2005 |
| JP | 2009-012356 A | 1/2009 |
| JP | 2013-098296 A | 5/2013 |
| JP | 2014099537 A | 5/2014 |
| JP | 2015-225941 A | 12/2015 |
| WO | 2004/016054 A1 | 2/2004 |

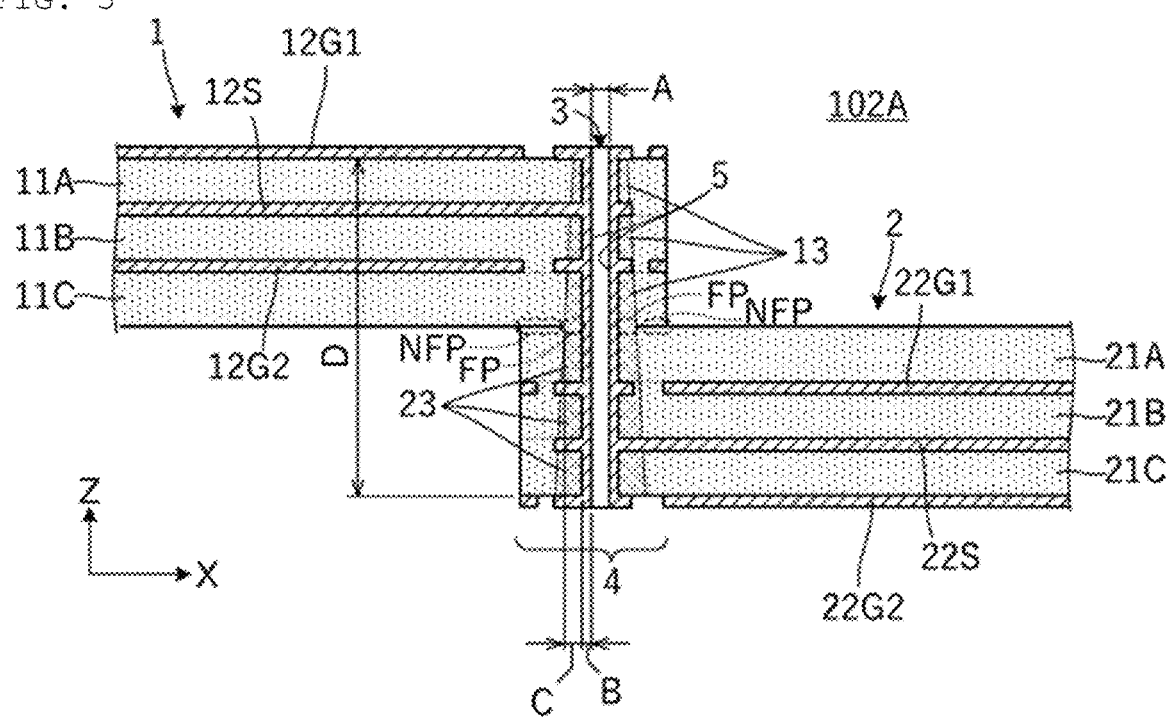

FIG. 4
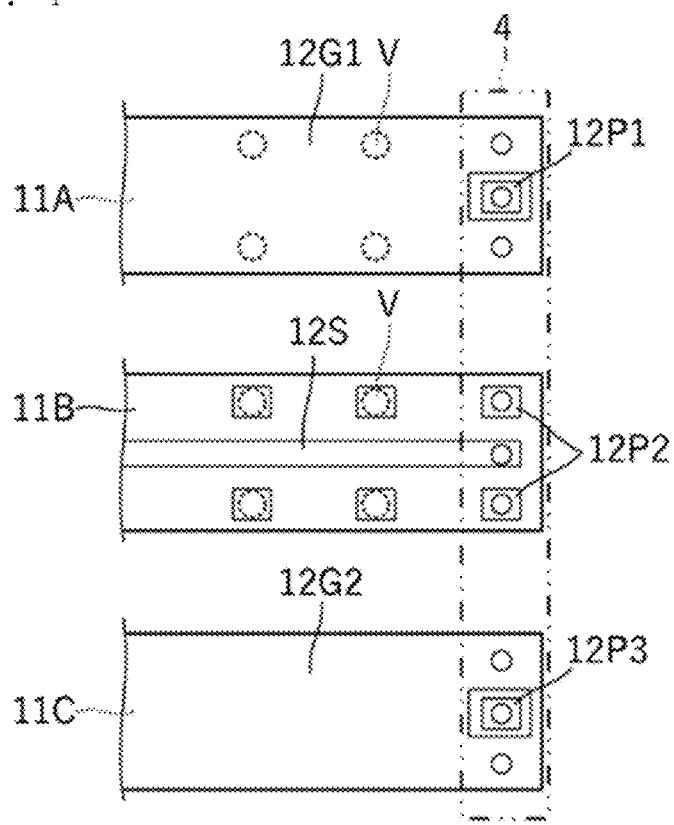
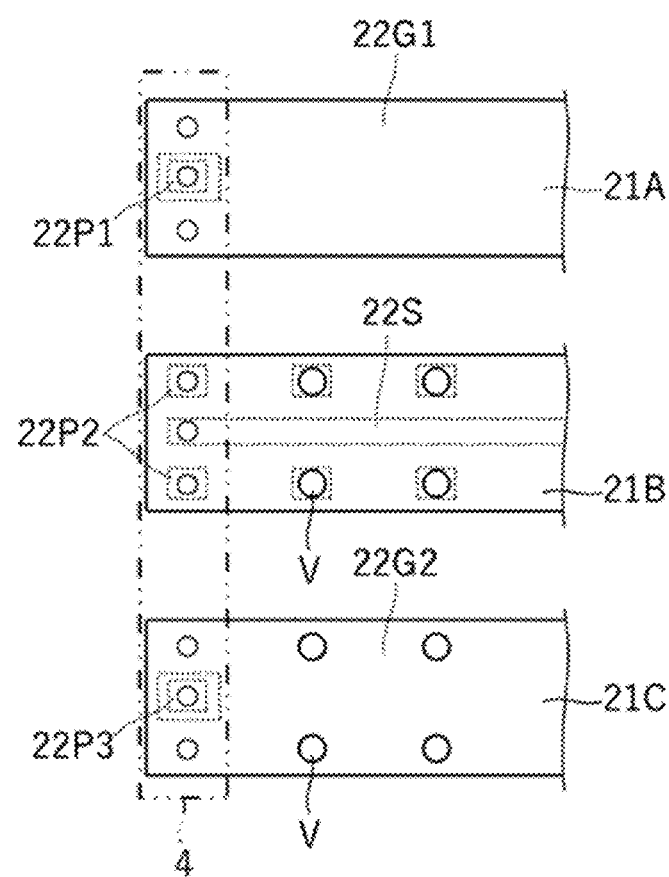

FIG. 7
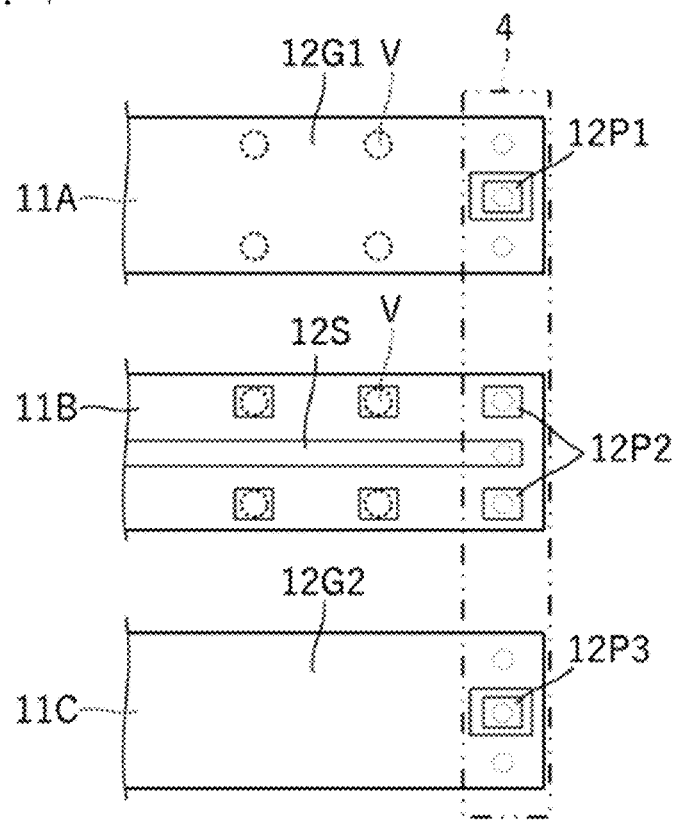
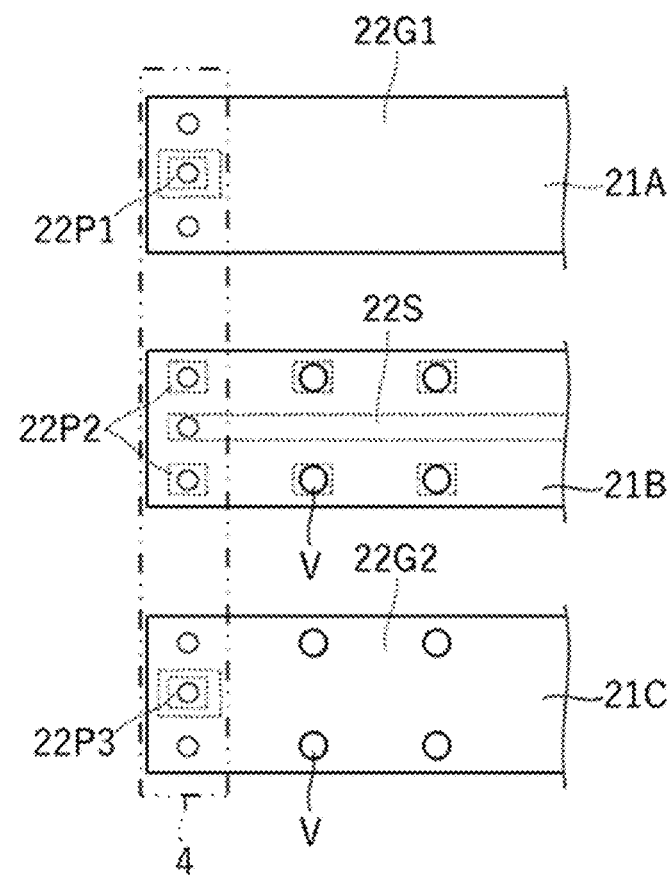

FIG. 10
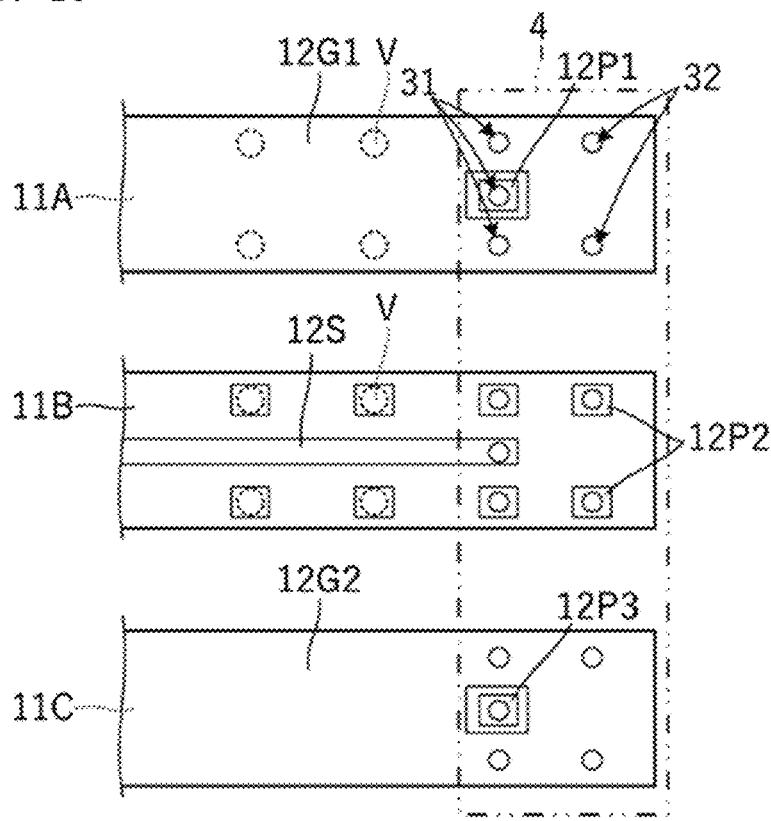
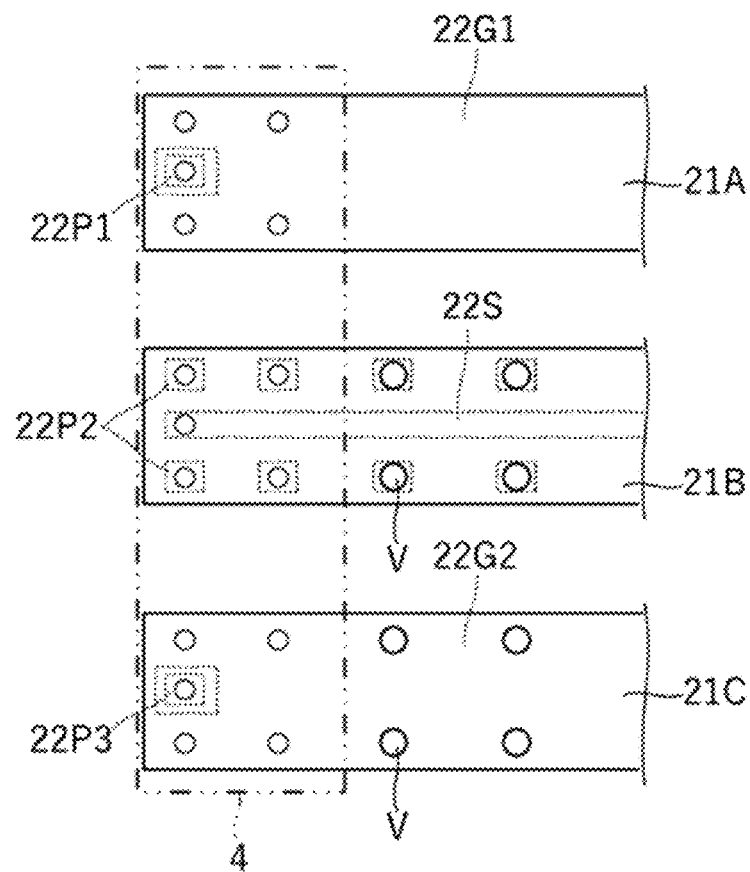

FIG. 13A
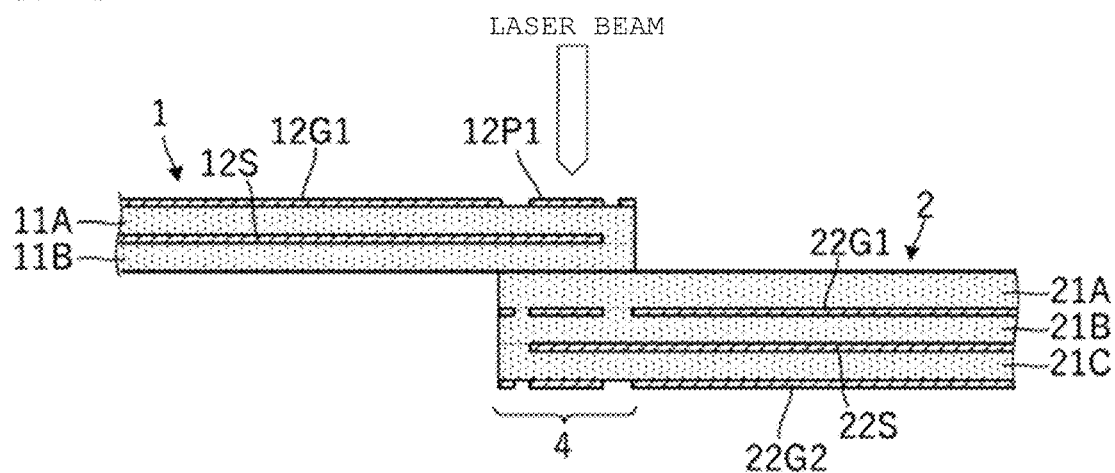
FIG. 13B
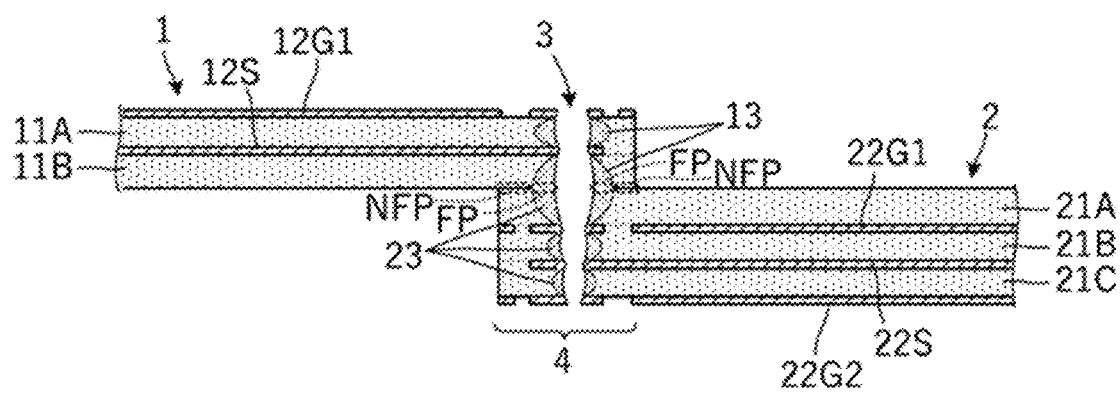
FIG. 13C
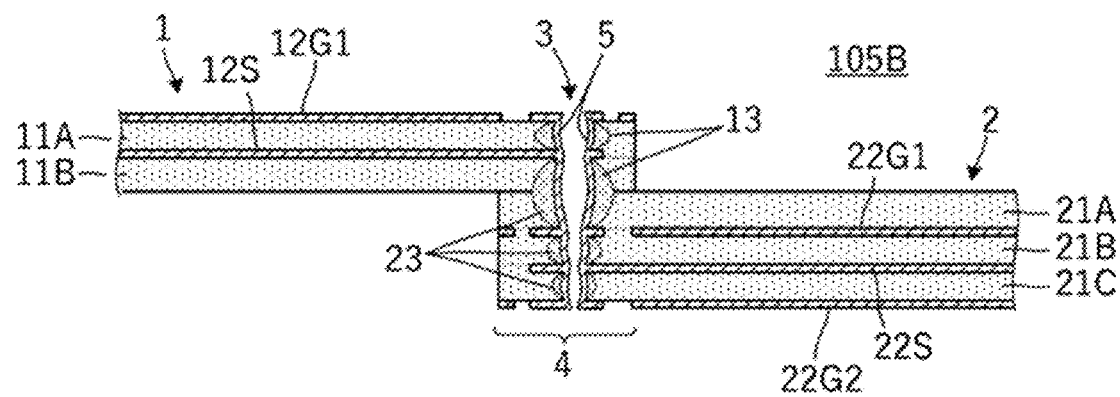
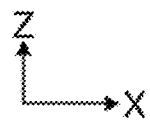

FIG. 14A
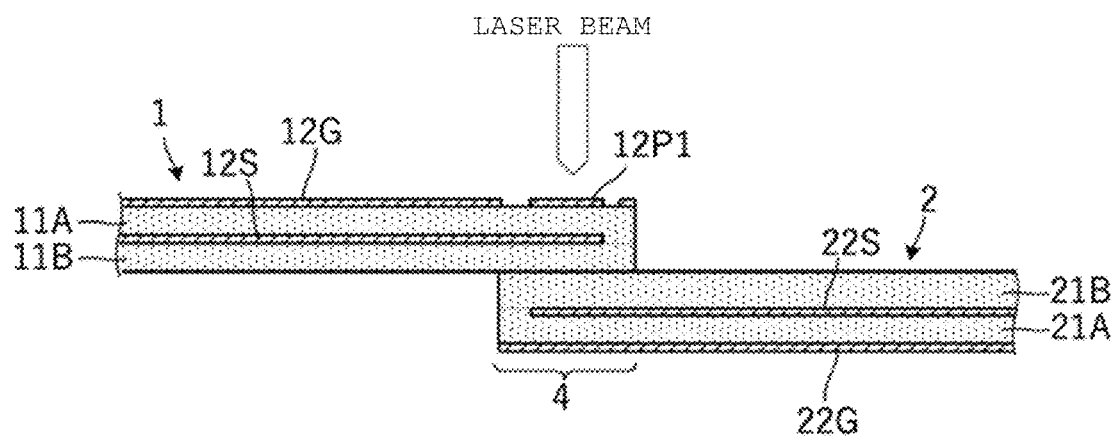
FIG. 14B
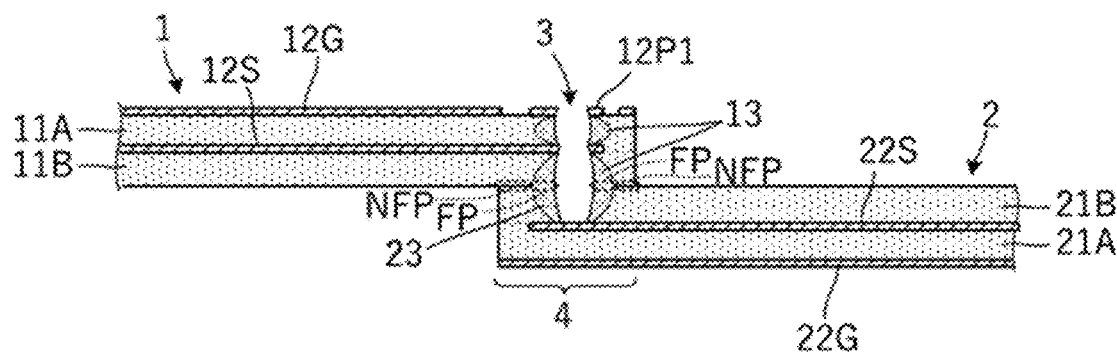
FIG. 14C
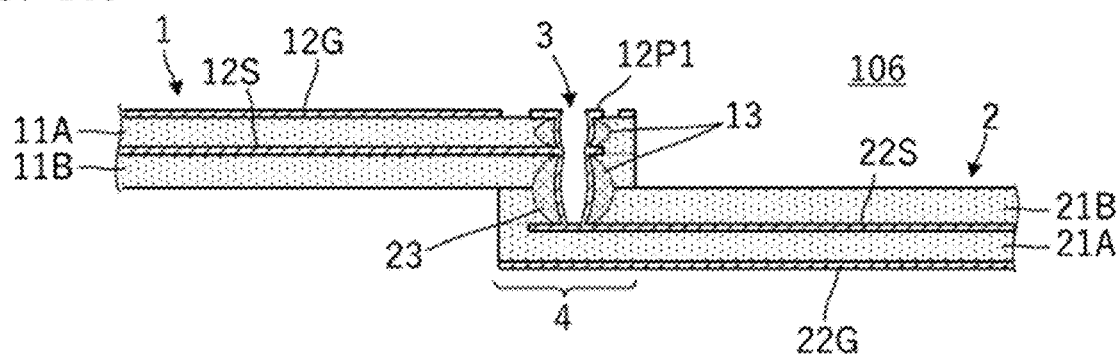

SUBSTRATE BONDING STRUCTURE

CROSS REFERENCE TO RELATED APPLICATIONS

This application claims the benefit of priority to Japanese Patent Application No. 2018-097085 filed on May 21, 2018 and is a Continuation Application of PCT Application No. PCT/JP2019/019609 filed on May 17, 2019. The entire contents of each application are hereby incorporated herein by reference.

BACKGROUND OF THE INVENTION

1. Field of the Invention

The present invention relates to a substrate bonding structure provided by bonding a plurality of substrates.

2. Description of the Related Art

To enhance functionality of a multilayer board, a method of bonding a plurality of substrates to form a composite substrate may be adopted. For example, Japanese Patent Application Laid-Open No. 2015-225941 discloses a multilayer board having a structure including a laminate of a plurality of insulating layers; an interlayer connection through-portion having a through-portion passing through the laminate in a laminated direction, and a metal film formed on a side wall of the through-portion, connecting conductor foil located on both main surfaces of the laminate to each other; and an interlayer connection conductor passing through the insulating layers, the conductor foil located on both the main surfaces of the laminate being connected to each other using the interlayer connection conductor.

The multilayer board described in Japanese Patent Application Laid-Open No. 2015-225941 is formed by a method including steps of aligning two substrates and joining the two substrates, which are separated, so that the two substrates are likely to be displaced. Thus, a substrate bonding structure having a predetermined shape or predetermined characteristics may not be obtained.

SUMMARY OF THE INVENTION

Preferred embodiments of the present invention provide substrate bonding structures each having a predetermined shape or predetermined characteristics by providing a bonding position of two substrates that is less likely to be displaced.

A substrate bonding structure according to a preferred embodiment of the present invention includes a first substrate including a resin substrate that melts by heating, and a second substrate including a resin substrate that melts by heating and an overlapping portion with the first substrate. The overlapping portion between the first substrate and the second substrate includes a hole continuously extending from the first substrate to the second substrate, and the first substrate and the second substrate are bonded to each other around the hole by fusing the resin substrates.

According to the structure described above, the first substrate and the second substrate are able to be bonded by fusing the resin substrates around the hole continuously extending from the first substrate to the second substrate. Thus, to provide this substrate bonding structure, the first substrate and the second substrate are bonded by providing the hole in the overlapping portion with the first substrate and the second substrate overlapping each other. That is, the hole is provided and the substrates are bonded at the same time or substantially at the same time, and a substrate bonding structure with little positional displacement between the two substrates is able to be provided.

The preferred embodiments of the present invention are able to provide substrate bonding structures in each of which a bonding position of two substrates is less likely to be displaced while having a predetermined shape or predetermined characteristics.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a sectional view of a substrate bonding structure according to a second preferred embodiment of the present invention.

FIG. 4 is an exploded plan view of a first substrate and a second substrate that define the substrate bonding structure illustrated in FIG. 3.

FIG. 7 is an exploded plan view of a first substrate and a second substrate that define the substrate bonding structure illustrated in FIG. 6.

FIG. 10 is an exploded plan view of a first substrate and a second substrate that define the substrate bonding structure illustrated in FIGS. 8A and 8B.

FIGS. 13A to 13C are each a diagram illustrating a manufacturing process of another substrate bonding structure according to the fifth preferred embodiment of the present invention.

FIGS. 14A to 14C are each a diagrams illustrating a manufacturing process of a substrate bonding structure according to a sixth preferred embodiment of the present invention.

DETAILED DESCRIPTION OF THE PREFERRED EMBODIMENTS

Figure 1A:
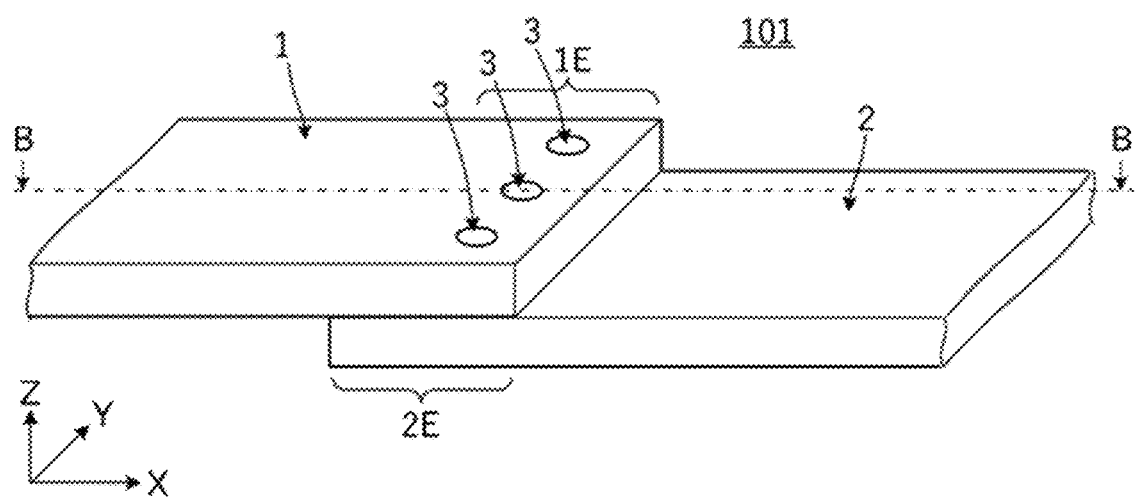
FIG. 1A is a perspective view of a substrate bonding structure according to a first preferred embodiment of the present invention.

Hereinafter, preferred embodiments of the present invention will be described with reference to the drawings. In each of the drawings, the same or similar portions are designated by the same reference numerals. Although the preferred embodiments are shown separately for convenience in consideration of description of main points or ease of understanding, structures shown in the different preferred embodiments can be partially replaced or combined. In second and subsequent preferred embodiments, description of matters common to a first preferred embodiment will be eliminated, and only different points will be described. In particular, the same or similar advantageous effects by the same or similar structure will not be sequentially referred to for each preferred embodiment.

First Preferred Embodiment

Figure 1B:
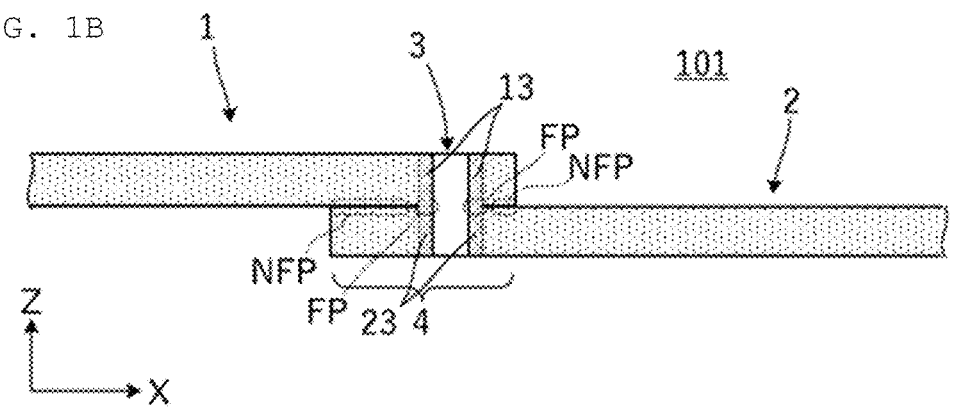
FIG. 1B is a longitudinal sectional view taken along line B-B in FIG. 1A.

FIG. 1A is a perspective view of a substrate bonding structure 101 according to a first preferred embodiment of the present invention, and FIG. 1B is a longitudinal sectional view taken along line B-B in FIG. 1A.

The substrate bonding structure 101 is formed by bonding a first substrate 1 and a second substrate 2 in a state of being overlapped in an overlapping portion 4. The first substrate 1 includes a first resin substrate that melts by heating, and a second substrate 2 includes a second resin substrate that melts by heating.

Three holes 3 each continuously extending from the first substrate 1 to the second substrate 2 are provided in the overlapping portion 4 of the first substrate 1 and the second substrate 2. The first substrate 1 includes a melted portion 13 of the first resin substrate around each of the holes 3, and the second substrate 2 includes a melted portion 23 of the second resin substrate around each of the holes 3. The first preferred embodiment includes the overlapping portion 4 that is located in an end portion 1E of the first substrate 1 and an end portion 2E of the second substrate 2.

The first substrate 1 and the second substrate 2 are bonded to each other with a fused portion FP provided therebetween. The fused portion FP is formed by fusing the melted portion 13 of the first resin substrate and the melted portion 23 of the second resin substrate.

Figure 2A:
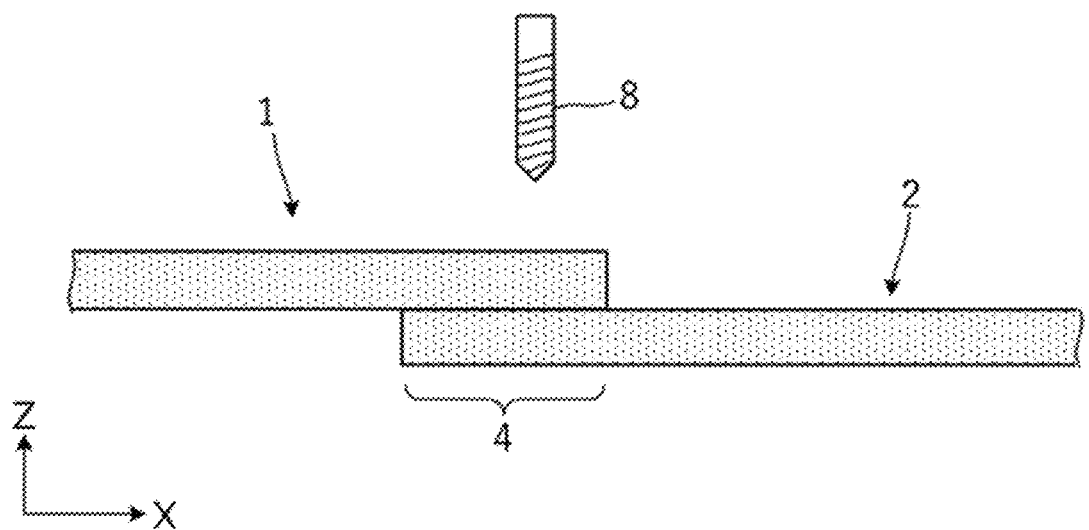
FIGS. 2A and 2B are each diagrams illustrating a manufacturing process of the substrate bonding structure shown in FIGS. 1A and 1B.
Figure 2B:
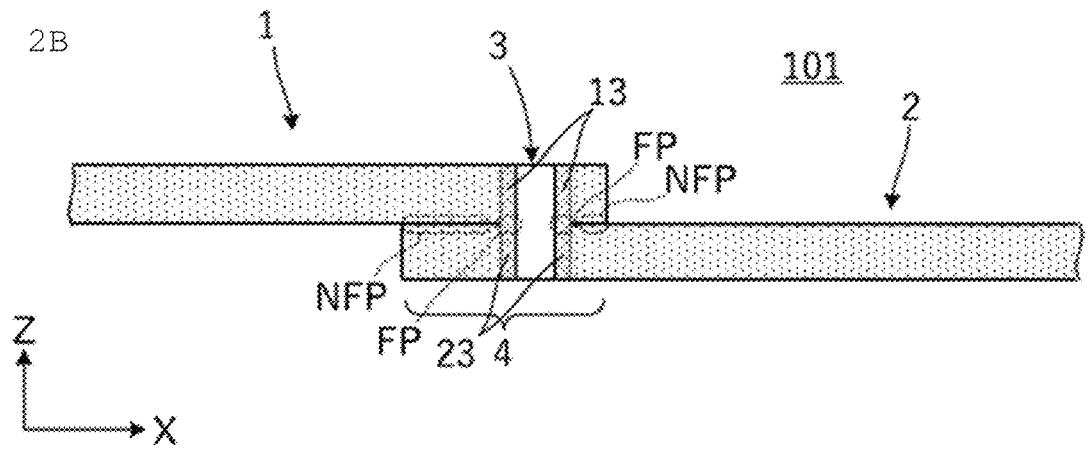

FIGS. 2A and 2B are each a diagram illustrating a manufacturing process of the substrate bonding structure 101. FIG. 2A is a sectional view of the first substrate 1 and the second substrate 2 in a partially overlapped state. FIG. 2B is a sectional view of a substrate bonding structure formed by drilling at a predetermined position in the overlapping portion 4 with a drill 8 from the state illustrated in FIG. 2A.

The first resin substrate of the first substrate 1 and the second resin substrate of the second substrate 2 are each preferably a laminate of thermoplastic resin, for example, a liquid crystal polymer (LCP). As illustrated in FIG. 2A, when a predetermined position in the overlapping portion 4 between the first substrate 1 and the second substrate 2 is drilled with a drill 8 rotating at a relatively high speed, the drill and a friction portion of each of the first substrate 1 and the second substrate 2 are heated by frictional heat. When temperature due to this heating increases to higher than melting temperature of the first resin substrate and the second resin substrate, for example, about 300° C. or higher, the melted portion 13 of the first resin substrate and the melted portion 23 of the second resin substrate are formed.

Then, the fused portion FP is formed in a boundary portion between the melted portion 13 of the first resin substrate and the melted portion 23 of the second resin substrate, in which the melted portion 13 and the melted portion 23 are fused with each other.

The first substrate 1 and the second substrate 2 are bonded to each other with the fused portion FP interposed therebetween. The overlapping portion 4 includes a region other than the fused portion FP, the region being a non-fused portion NFP. Although heating and fusing the entire or substantially the entire bonding surface between the first substrate 1 and the second substrate 2 causes the entire or substantially entire bonded portion between the first substrate 1 and the second substrate 2 to be easily deformed in shape, providing the non-fused portion NFP in a bonded portion between the first substrate 1 and the second substrate 2, as in the present preferred embodiment, reduces or prevents deformation of the bonded portion.

As described above, the first substrate 1 and the second substrate 2 are bonded by drilling a predetermined position of the overlapping portion 4 with the drill 8 in a state where the first substrate 1 and the second substrate 2 are overlapped with each other.

The fused portion FP may not be continuously formed throughout an inner circumference of the hole 3. The first substrate 1 and the second substrate 2 are preferably bonded to each other in, for example, about 80% or more of the inner circumference of the hole 3. That is, providing the fused portion in about 80% or more of the inner circumference of the hole provides relatively high bonding strength between the first substrate 1 and the second substrate 2.

If a conductor exposed portion is provided between the first substrate 1 and the second substrate 2, the first substrate 1 and the second substrate 2 are preferably fused with each other in, for example, about 80% or more of an area of a portion, where the first substrate and the second substrate face each other, to provide relatively high adhesion strength.

The first substrate 1 and the second substrate 2 may be bonded to each other with a bonding material provided therebetween in the non-fused portion NFP. In this case, if a conductor exposed portion is provided between the first substrate 1 and the second substrate 2, the first substrate 1 and the second substrate 2 are preferably adhered with the bonding material interposed therebetween in, for example, about 80% or more of an area of a portion, where the first substrate and the second substrate face each other, to provide relatively high adhesion strength.

Second Preferred Embodiment

In a second preferred embodiment of the present invention, an example of a substrate bonding structure including a hole for electrically connecting conductor patterns provided on two substrates to each other will be described.

FIG. 3 is a sectional view of a substrate bonding structure 102A according to the second preferred embodiment. This substrate bonding structure 102A is formed by bonding a first substrate 1 and a second substrate 2.

The first substrate 1 includes first resin substrates 11A, 11B, and 11C, and conductor patterns 12G1, 12S, and 12G2. The second substrate 2 includes second resin substrates 21A, 21B, and 21C, and conductor patterns 22G1, 22S, and 22G2.

The conductor patterns 12G1 and 12G2 that are each a ground conductor pattern, and the conductor pattern 12S that is a signal conductor pattern, define a first strip line. Similarly, the conductor patterns 22G1 and 22G2 that are each a ground conductor pattern, and the conductor pattern 22S that is a signal conductor pattern, define a second strip line. The substrate bonding structure 102A as an example of this structure includes the first strip line and the second strip line connected to each other.

The substrate bonding structure 102A is formed by bonding the first substrate 1 and the second substrate 2 in a state of being overlapped in an overlapping portion 4. The first resin substrates 11A, 11B, and 11C and the second resin substrates 21A, 21B, and 21C are melted by heating. The first substrate 1 includes a melted portion 13 of each of the first resin substrates 11A, 11B, and 11C around a hole 3, and the second substrate 2 includes a melted portion 23 of each of the second resin substrates 21A, 21B, and 21C around the hole 3.

The first substrate 1 and the second substrate 2 are bonded to each other with a fused portion FP between the melted portion 13 of the first resin substrate and the melted portion 23 of the second resin substrate.

The hole 3 is provided inside with an in-hole conductor 5. At the position in the section illustrated in FIG. 3, the conductor pattern 12S of the first substrate 1 and the conductor pattern 22S of the second substrate 2 are electrically connected to each other by the in-hole conductor 5.

FIG. 4 is an exploded plan view of the first substrate 1 and the second substrate 2 defining the substrate bonding structure 102A illustrated in FIG. 3.

As illustrated in FIG. 4, the conductor pattern 12G1 and a pad 12P1 are provided on an upper surface of the first resin substrate 11A. Similarly, the conductor pattern 12G2 and a pad 12P3 are provided on an upper surface of the first resin substrate 11C. Additionally, the conductor pattern 12S and a pad 12P2 are provided on an upper surface of the first resin substrate 11B. The first resin substrates 11A and 11B are each provided with a plurality of via conductors V.

Similarly, the conductor pattern 22G1 and a pad 22P1 are provided on a lower surface of the second resin substrate 21A, and the conductor pattern 22G2 and a pad 22P3 are provided on a lower surface of the second resin substrate 21C. Additionally, the conductor pattern 22S and a pad 22P2 are provided on a lower surface of the second resin substrate 21B. The second resin substrates 21B and 21C are each provided with a plurality of via conductors V.

The first resin substrates 11A, 11B, and 11C, and the second resin substrate 21A, 21B, and 21C, are each preferably a liquid crystal polymer (LCP), for example. The conductor patterns 12G1, 12G2, and 12S, and the pads 12P1, 12P2, and 12P3, are patterned on Cu foil, for example, attached to the corresponding first resin substrates 11A, 11B, and 11C. The plurality of via conductors V provided on the first resin substrates 11A and 11B is conductive paste filled in pores provided on the first resin substrates 11A and 11B. Similarly, the plurality of via conductors V provided on the second resin substrates 21B and 21C is conductive paste filled in pores provided on the second resin substrates 21B and 21C. This conductive paste preferably includes powder of a metal, for example, Cu, Sn, or an alloy thereof, and resin material, and defines and functions as an interlayer connecting conductor by being cured by a subsequent heat-press treatment.

Figure 5A:
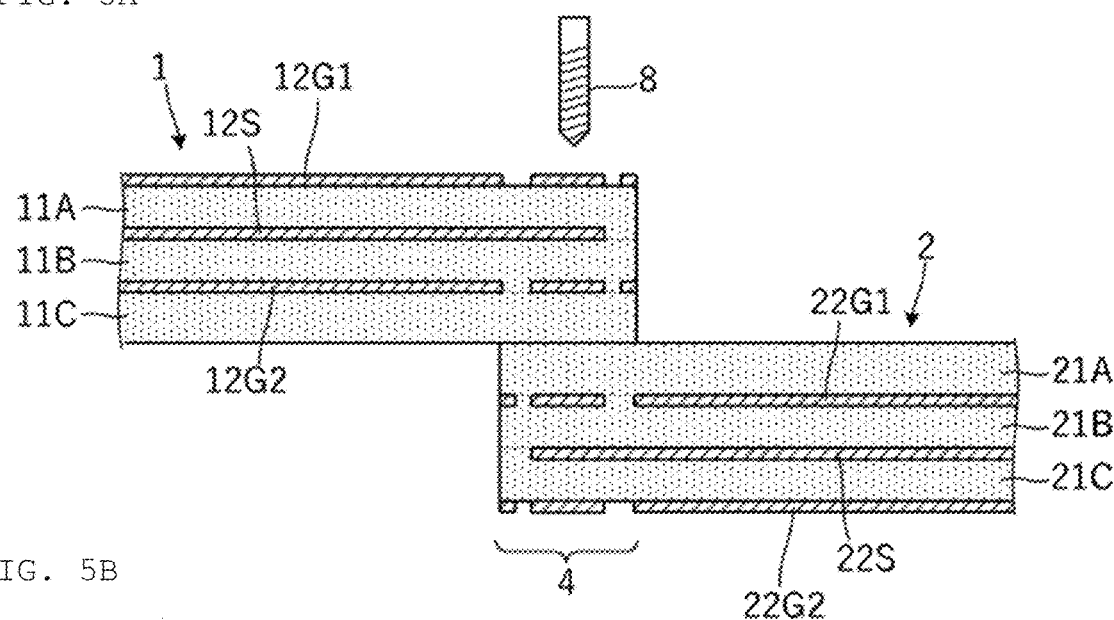
FIGS. 5A to 5C are each a diagram illustrating a manufacturing process of the substrate bonding structure shown in FIG. 3.
Figure 5B:
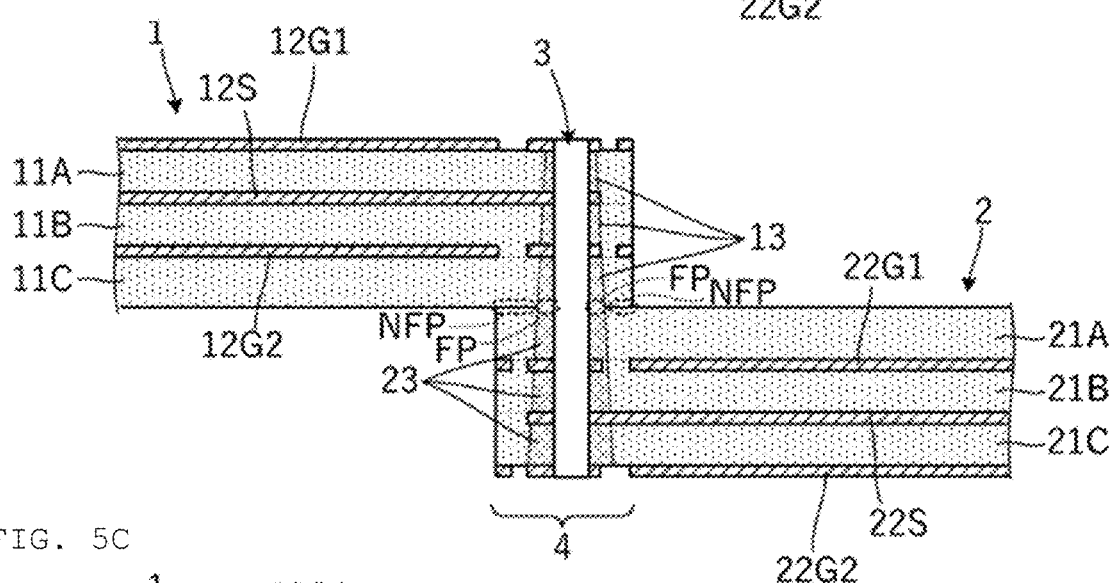
Figure 5C:
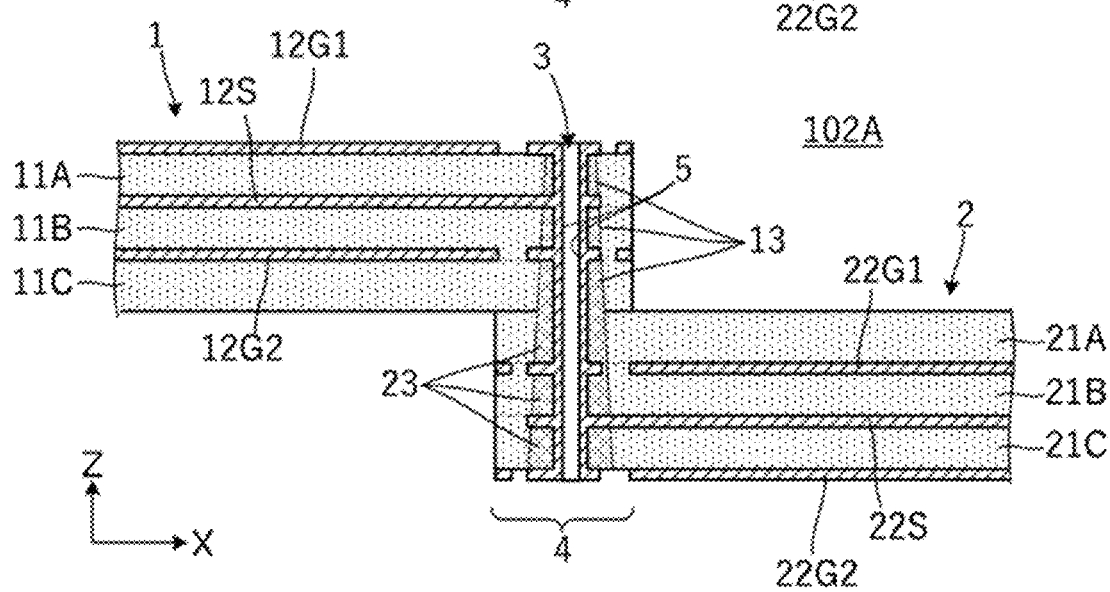

FIGS. 5A to 5C are each a diagram illustrating a manufacturing process of the substrate bonding structure 102A. FIG. 5A is a sectional view of the first substrate 1 and the second substrate 2 in a partially overlapped state. FIG. 5B is a sectional view of a substrate bonding structure formed by subsequently drilling at a predetermined position in the overlapping portion 4 with a drill 8 in the state illustrated in FIG. 5A. FIG. 5C is a sectional view of the substrate bonding structure in a state where the in-hole conductor 5 is subsequently formed in the hole 3 in the state illustrated in FIG. 5B.

The first resin substrates 11A, 11B, and 11C of the first substrate 1, and the second resin substrates 21A, 21B, and 21C of the second substrate 2, are each preferably a laminate of thermoplastic resin, for example, a liquid crystal polymer. As illustrated in FIG. 5A, when a predetermined position in the overlapping portion 4 between the first substrate 1 and the second substrate 2 is drilled with a drill 8 rotating at a relatively high speed, the drill and a friction portion of each of the first substrate 1 and the second substrate 2 are heated by frictional heat to form the melted portion 13 of the first resin substrate and the melted portion 23 of the second resin substrate. Accordingly, the first substrate 1 and the second substrate 2 are bonded to each other with the fused portion FP that is a boundary portion between the melted portion 13 of the first resin substrate and the melted portion 23 of the second resin substrate, as illustrated in FIG. 3.

The first resin substrates 11A, 11B, and 11C, and the second resin substrates 21A, 21B, and 21C, are each preferably a resin substrate having a property of increasing in melting point to higher than an original melting point before heating when receiving a temperature higher than the original melting point, for example, a liquid crystal polymer. By cutting processing with a drill, cutting heat is more likely to be accumulated in a cutting member with an increase in drilling depth, and thus the melted portion 23 of the second resin substrate 21C has a larger thickness in a radial direction (diameter direction) from the center axis of the hole 3 than the melted portion 13 of the first resin substrate 11A. Accordingly, a melting point of the melted portion 23 of the second substrate 2 is higher than a melting point of the melted portion 13 of the first substrate 1.

Additionally, a melting point of the melted portion 13 of each of the first resin substrates 11A, 11B, and 11C is higher than a melting point of the non-fused portion NFP of the first resin substrates 11A, 11B, and 11C. Similarly, a melting point of the melted portion 23 of each of the second resin substrates 21A, 21B, and 21C is higher than a melting point of the non-fused portion NFP of the second resin substrates 21A, 21B, and 21C. Accordingly, a crack or the like at a bonded portion between substrates is less likely to occur when the substrate bonding structure is subsequently heated by a reflow soldering method.

Cu plating or solder plating, for example, is applied to the inner surface of the hole 3 to form the in-hole conductor 5, as illustrated in FIG. 5C.

As described in the present preferred embodiment, the hole 3 bonds two substrates to each other and also electrically connects conductor patterns to each other.

Dimensions of respective portions in FIG. 3 and a relationship between sizes of the respective portions are as follows.

An average inner diameter of the hole 3 is designated as A, a thickness of the in-hole conductor 5 in the radial direction is designated as B, a thickness of the fused portion FP in the radial direction from the center of the hole 3 is designated as C, a total thickness of an overlapping portion between the first substrate 1 and the second substrate 2 is designated as D. Then, preferably, A is about 0.03 mm or more and about 0.1 mm or less, B is about 0.01 mm or more when D is about 0.5 mm or less, B is about 0.02 mm or more when D is about 1.0 mm or more, and C is about 0.02 mm or more and about 0.1 mm or less, for example.

Then, the present preferred embodiment has a relationship in which C is less than D, and B is less than C.

As described above, when C is set to about 0.02 mm or more and about 0.1 mm or less, thermal strain of the substrates is able to be reduced while bondability between the first substrate and the second substrate is able to be provided.

Although an increase in thickness of the first substrate 1 and the second substrate 2 increases a concentration of stress on the in-hole conductor 5 due to external stress or bending, setting B to about 0.01 mm or more when D is about 0.5 mm or less and B to about 0.02 mm or more when D is about 1.0 mm or more as described above provides a relatively high strength of the in-hole conductor 5.

Figure 6:
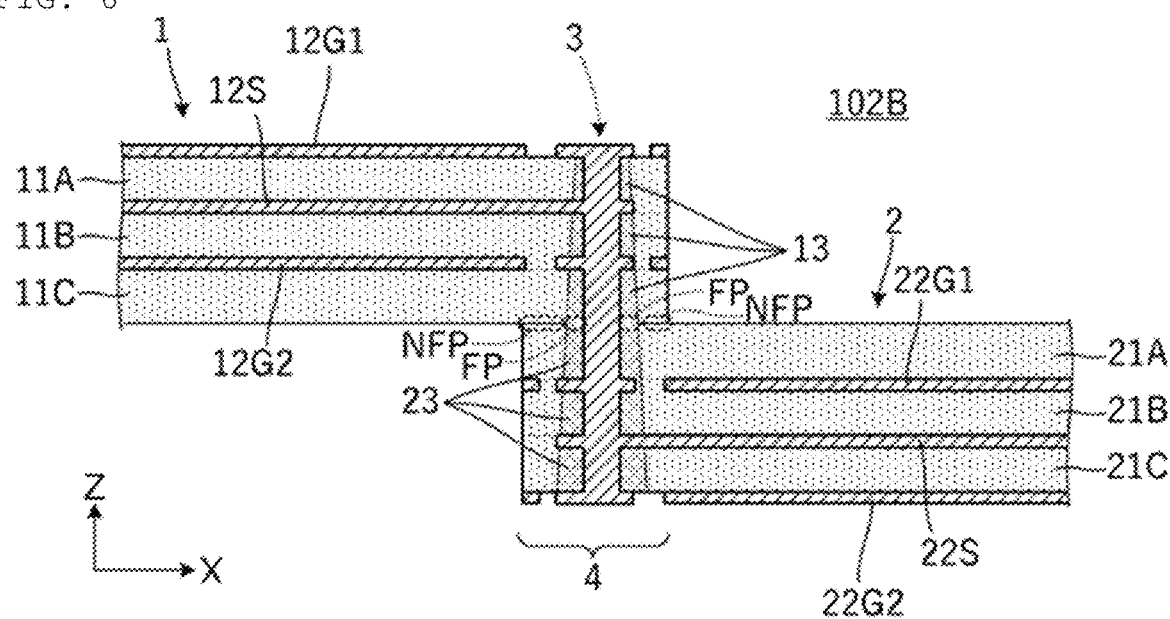
FIG. 6 is a sectional view of another example of a substrate bonding structure according to the second preferred embodiment of the present invention.

FIG. 6 is a sectional view of another substrate bonding structure 102B according to the second preferred embodiment.

FIG. 7 is an exploded plan view of a first substrate 1 and a second substrate 2 defining the substrate bonding structure 102B illustrated in FIG. 6.

Similar to the substrate bonding structure 102A illustrated in FIG. 3, the first substrate 1 and the second substrate 2 are bonded to each other with a fused portion FP between a melted portion 13 of a first resin substrate and a melted portion 23 of a second resin substrate. A structure of a hole 3 is different from that of the substrate bonding structure 102A illustrated in FIG. 3. The substrate bonding structure 102B includes an in-hole conductor 5 filled inside the hole 3. The in-hole conductor 5 is formed by subsequently filling the inside of the hole 3 with, for example, Cu by a filled plating method in the state illustrated in FIG. 5B.

For example, the inside of the hole 3 is treated with a plating solution prepared by adding a plating inhibitor and a plating accelerator to copper sulfate. Other structures are the same or substantially the same as those of the substrate bonding structure 102A.

Besides the structure in which the filled plating is applied to the inside of the hole 3, the inside of the hole 3 may be filled with resin, for example. When the inside of the hole 3 is filled with resin, the hole is less likely to be deformed by external stress, bending stress, or the like. Thus, the resin filled in the hole 3 preferably has a higher Young's modulus than the substrates defining the first substrate 1 and the second substrate 2.

Third Preferred Embodiment

In a third preferred embodiment of the present invention, a substrate bonding structure including a first hole and a second hole will be described.

Figure 8A:
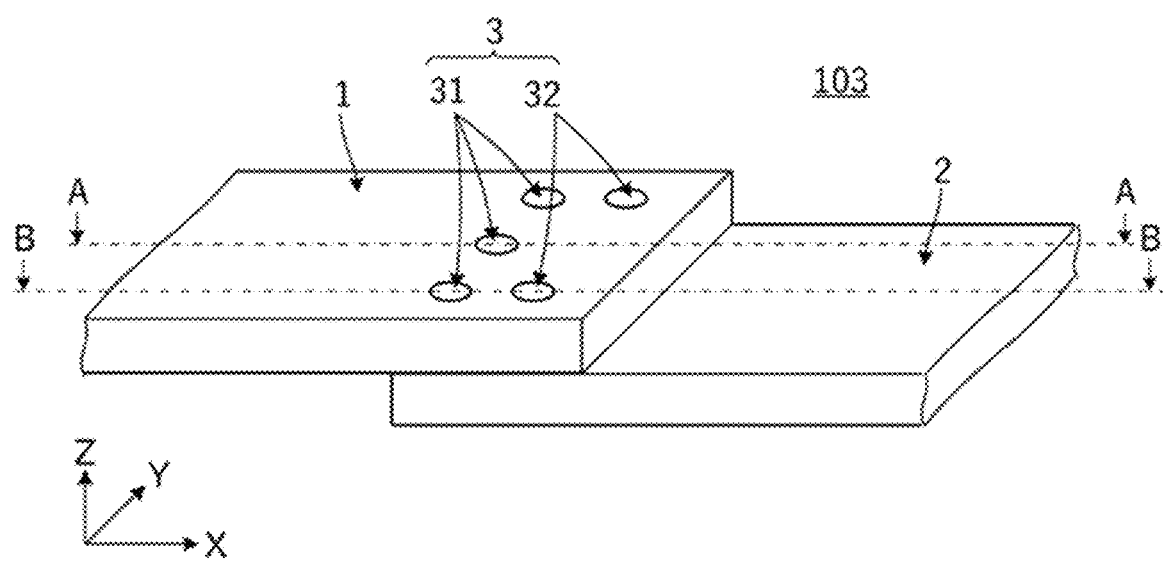
FIG. 8A is a perspective view of a substrate bonding structure according to a third preferred embodiment of the present invention.

FIG. 8A is a perspective view of a substrate bonding structure 103 according to a third preferred embodiment.

Figure 8B:
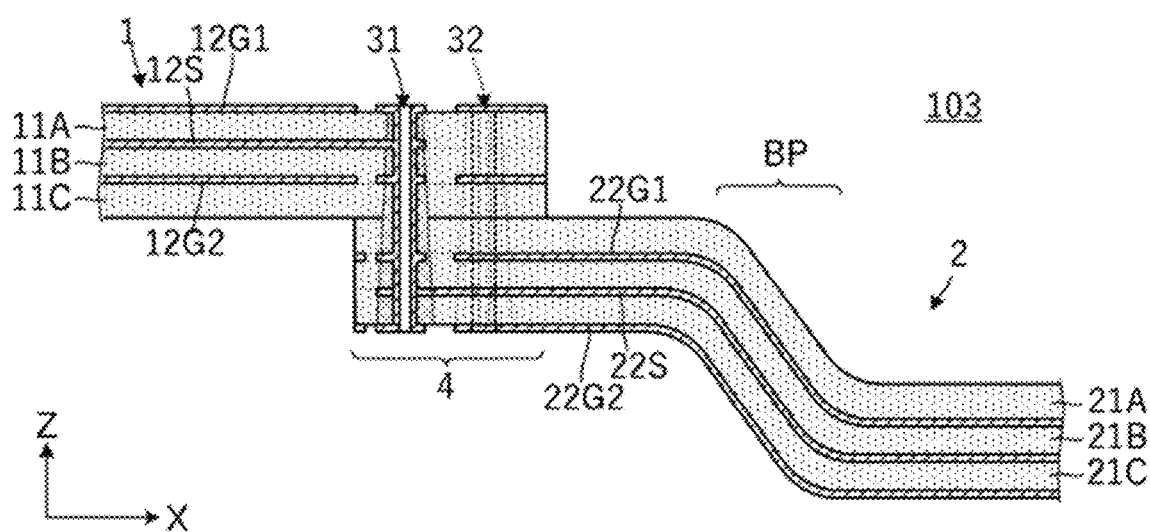
FIG. 8B is a sectional view taken along line A-A in FIG. 8A.
Figure 9A:
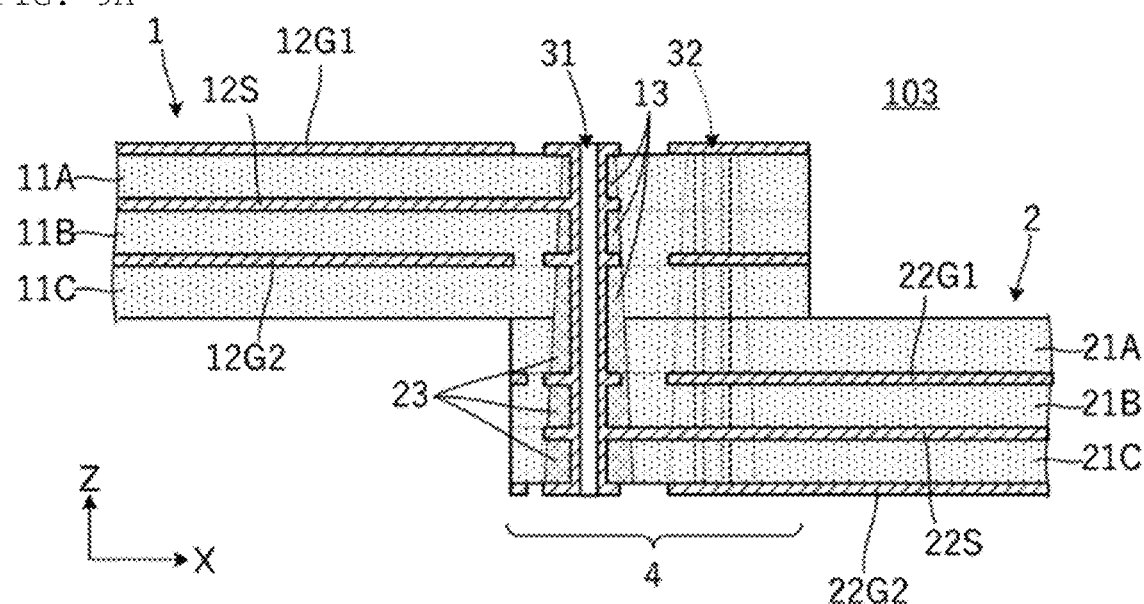
FIG. 9A is a sectional view taken along line A-A in FIG. 8A.
Figure 9B:
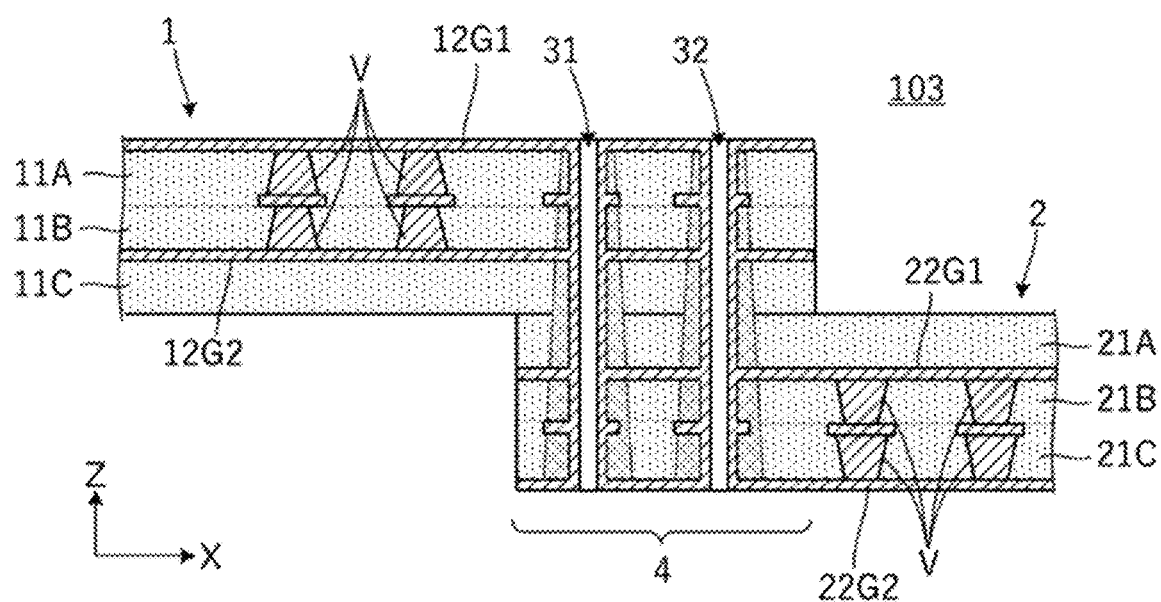
FIG. 9B is a sectional view taken along line B-B in FIG. 8A.

FIG. 8B is a sectional view taken along line A-A in FIG. 8A. FIG. 9A is a sectional view taken along line A-A in FIG. 8A, and FIG. 9B is a sectional view taken along line B-B in FIG. 8A. FIGS. 9A and 9B each illustrate a vicinity of holes 31 and 32. FIG. 10 is an exploded plan view of a first substrate 1 and a second substrate 2 defining the substrate bonding structure 103 illustrated in FIGS. 8A and 8B.

This substrate bonding structure 103 is formed by bonding the first substrate 1 and the second substrate 2 in a state of being overlapped in an overlapping portion 4. As illustrated in FIG. 9B, a conductor pattern 12G1 and a conductor pattern 12G2 of the first substrate 1 are electrically connected to each other by via conductors V. Similarly, a conductor pattern 22G1 and a conductor pattern 22G2 of the second substrate 2 are electrically connected to each other by via conductors V.

In contrast to the example illustrated in FIGS. 1A and 1B, the overlapping portion 4 is provided with two holes 31 in one row and three holes 32 in another row.

Each of the holes 31 is the first hole that electrically connects a conductor pattern 12S of the first substrate 1 and a conductor pattern 22S of the second substrate 2 by an in-hole conductor 5. Each of the holes 32 is the second hole that electrically connects the conductor patterns 12G1 and 12G2 of the first substrate 1 to the conductor patterns 22G1 and 22G2 of the second substrate 2. This second hole 32 does not electrically connect a signal conductor pattern of the first substrate 1 to a signal conductor pattern of the second substrate 2. The first hole 31 and the second hole 32 are formed by the same or substantially the same method.

The second substrate 2 is provided with a bent portion BP. The second hole 32 is provided at a position closer to the bent portion BP than the first hole 31. FIG. 8B illustrates the second hole 32 and the first hole 31 that are provided in this order in −X direction (one side) with respect to the bent portion BP. That is, the second hole 32 is provided at a position closer to the bent portion BP than the first hole 31.

According to the structure described above, bending stress at the bent portion BP is borne by the second hole 32. That is, bending stress applied to the first hole 31 is significantly reduced. Thus, a connection portion between the (important) signal conductor pattern 12S and the signal conductor pattern 22S, which are important and electrically connected only at one place, is mechanically protected.

Although in the present preferred embodiment, the conductor patterns 12G1 and 12G2 of the first substrate 1 and the conductor patterns 22G1 and 22G2 of the second substrate 2 are electrically connected to each other by the second hole 32, the conductor patterns 12G1 and 12G2 of the first substrate 1 and the conductor patterns 22G1 and 22G2 of the second substrate 2 are originally electrically connected to each other by the holes 31 on both sides of the three first holes 31. Thus, the second hole 32 may be a (dummy) hole that is dedicated to bonding the substrates and that does not particularly provide an electrical connection between the conductor pattern of the first substrate 1 and the conductor pattern of the second substrate 2.

Fourth Preferred Embodiment

In a fourth preferred embodiment of the present invention, a substrate bonding structure including a non-through hole will be described.

Figure 11A:
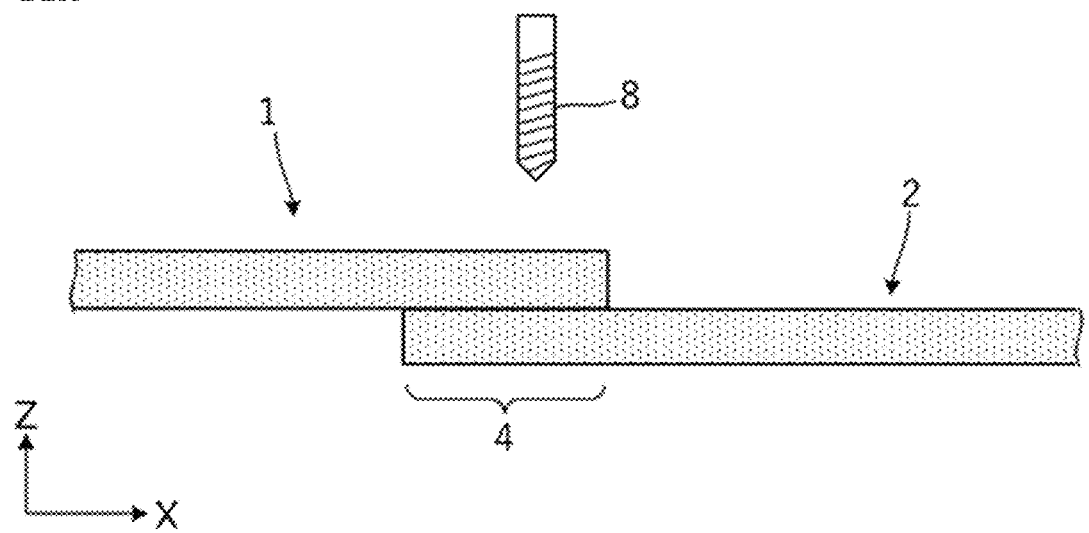
FIGS. 11A and 11B are each a diagram illustrating a manufacturing process of a substrate bonding structure according to a fourth preferred embodiment of the present invention.
Figure 11B:
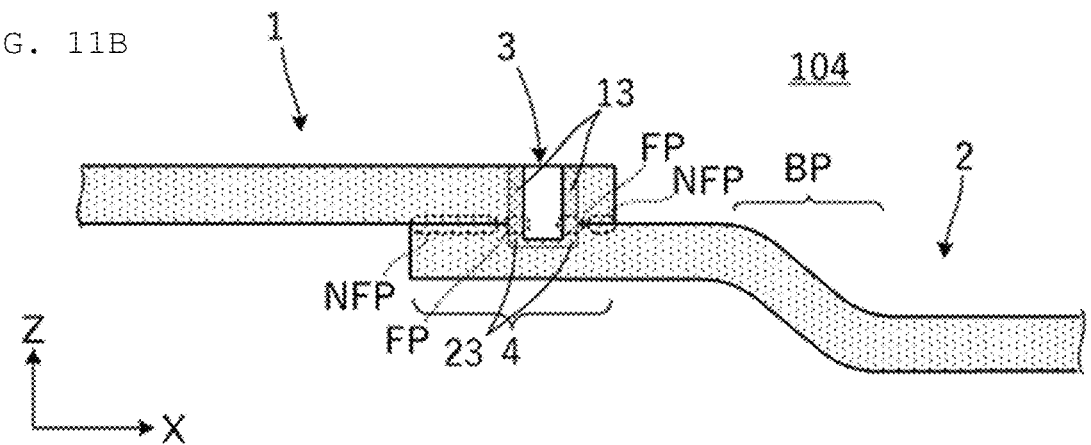

FIGS. 11A and 11B are each a diagram illustrating a manufacturing process of a substrate bonding structure 104. FIG. 11A is a sectional view of a first substrate 1 and a second substrate 2 in a partially overlapped state. FIG. 11B is a sectional view of a substrate bonding structure formed by drilling at a predetermined position in an overlapping portion 4 with a drill 8 from the state illustrated in FIG. 11A.

The substrate bonding structure 104 of the present preferred embodiment includes a hole 3 that passes through the first substrate 1 and does not pass through the second substrate 2.

The first substrate 1 and the second substrate 2 are bonded to each other with a fused portion FP between a melted portion 13 of a first resin substrate of the first substrate 1 and a melted portion 23 of a second resin substrate of the second substrate 2.

As long as the hole 3 has a depth that is able to form the melted portion 13 of the first resin substrate of the first substrate 1 and the melted portion 23 of the second resin substrate of the second substrate 2, the hole 3 may be a non-through hole. According to the structure described above, the overlapping portion 4 of the second substrate 2 is less likely to decrease in rigidity as compared with the structure in which a through-hole 3 is provided. Thus, even when the bent portion BP is provided, stress is less likely to be applied to the fused portion FP, and thus bonding strength between the first substrate 1 and the second substrate 2 is able to be increased.

Fifth Preferred Embodiment

In a fifth preferred embodiment of the present invention, an example different in shape and a method for forming a hole from the examples described above will be described.

Figure 12A:
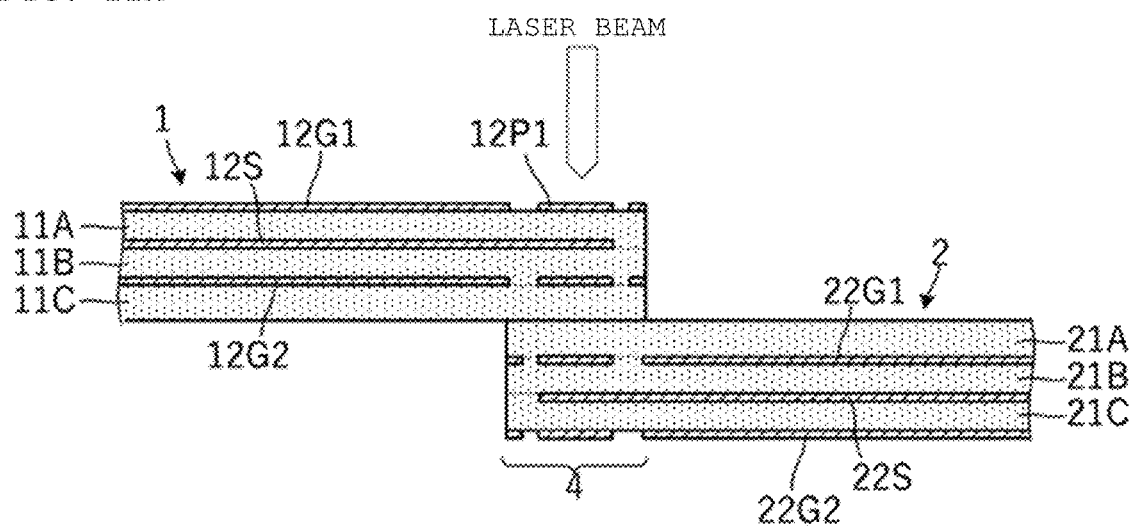
FIGS. 12A to 12C are each diagrams illustrating a manufacturing process of a substrate bonding structure according to a fifth preferred embodiment of the present invention.
Figure 12B:
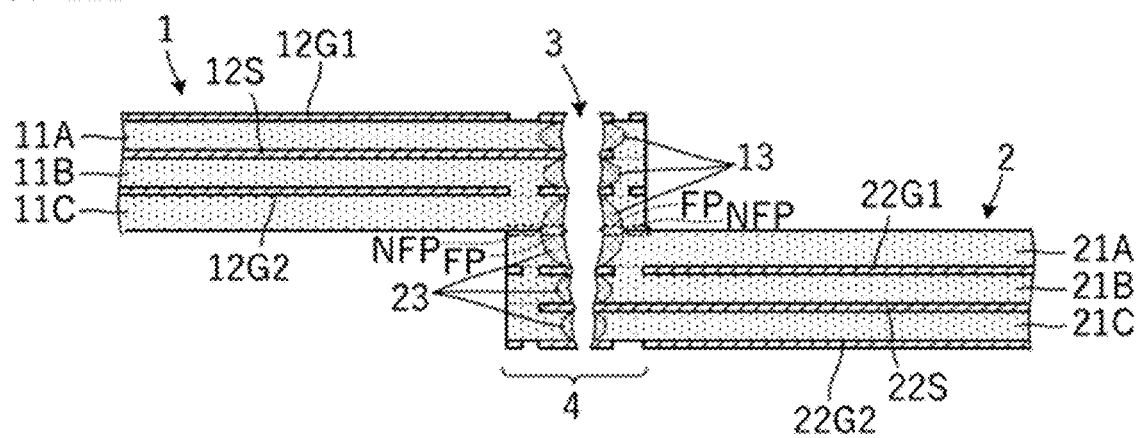
Figure 12C:
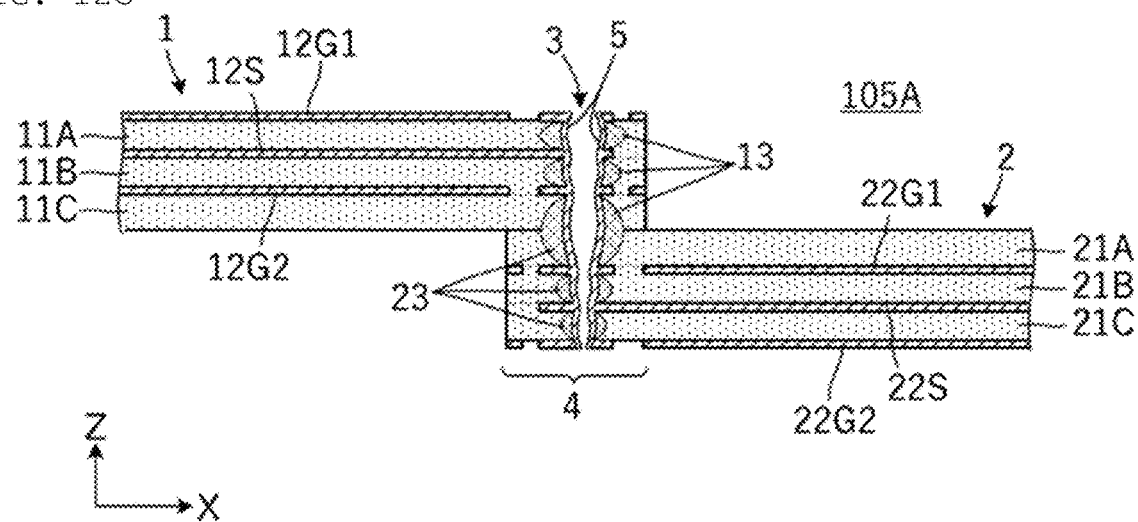

FIGS. 12A to 12C are each a diagram illustrating a manufacturing process of a substrate bonding structure 105A. FIG. 12A is a sectional view of a first substrate 1 and a second substrate 2 in a partially overlapped state. FIG. 12B is a sectional view of a substrate bonding structure in which a hole 3 is subsequently formed by irradiating a predetermined position in an overlapping portion 4 with a laser beam in the state illustrated in FIG. 12A. FIG. 12C is a sectional view of the substrate bonding structure in a state where an in-hole conductor 5 is subsequently formed in the hole 3 in the state illustrated in FIG. 12B.

First resin substrates 11A, 11B, and 11C of the first substrate 1, and second resin substrates 21A, 21B, and 21C of the second substrate 2, are each preferably a laminate of thermoplastic resin, for example, a liquid crystal polymer. As illustrated in FIGS. 12A and 12B, when a predetermined position in the overlapping portion 4 between the first substrate 1 and the second substrate 2 is irradiated with a beam of a $CO_2$ laser, the irradiated position is heated to form a melted portion 13 of each of the first resin substrates and a melted portion 23 of each of the second resin substrates. Accordingly, the first substrate 1 and the second substrate 2 are bonded to each other with a fused portion FP where the melted portion 13 of the first resin substrate and the melted portion 23 of the second resin substrate are fused with each other in a boundary portion therebetween.

Cu plating or solder plating, for example, is applied to an inner surface of the hole 3 to form the in-hole conductor 5, as illustrated in FIG. 12C.

A browning treatment is applied to the Cu attached to the first resin substrate 11A, 11B, and 11C, and the second resin substrate 21A, 21B, and 21C. This treatment is a treatment of roughening a surface of Cu foil by etching, for example. This increases a surface area of the irradiation position, so that absorption of the $CO_2$ laser is improved, and thus the $CO_2$ laser can pass through a pad 12P1 (Cu foil). This browning treatment may be applied only to the pad 12P1 that is an incident surface of the laser beam.

When a hole is formed by laser processing as in the present preferred embodiment, the hole on a laser irradiation surface side has a tapered shape.

Energy injected into the first substrate 1 on the irradiation side of the laser beam is larger than that on a second substrate 2 side, and the melted portion 13 of the first resin substrate has a larger volume than the melted portion 23 of the second resin substrate. Thus, the hole 3 has an average diameter larger in the first substrate 1 than in the second substrate 2 so as to have a tapered shape.

FIGS. 13A to 13C are each a diagram illustrating a manufacturing process of a substrate bonding structure 105B. FIG. 13A is a sectional view of a first substrate 1 and a second substrate 2 in a partially overlapped state. FIG. 13B is a sectional view of a substrate bonding structure in which a hole 3 is subsequently formed by irradiating a predetermined position in an overlapping portion 4 with a laser beam in the state illustrated in FIG. 13A. FIG. 13C is a sectional view of the substrate bonding structure in a state where an in-hole conductor 5 is subsequently formed in the hole 3 in the state illustrated in FIG. 13B. The first substrate 1 is different in thickness from the example shown in FIGS. 12A to 12C.

When the hole is formed by laser processing as described above, the hole 3 has a tapered shape having a diameter increasing toward on an irradiation surface of the laser beam. Thus, when the first substrate 1 is reduced in thickness to less than that of the second substrate 2 as illustrated in FIGS. 13A to 13C, more laser energy is likely to reach a bonded portion to increase a fusion area. Accordingly, adhesive strength is able to be easily increased and fusion is able to be completed in a relatively short time as compared with when the same layer structure is drilled.

Sixth Preferred Embodiment

In a sixth preferred embodiment of the present invention, the structure of another hole formed by laser processing will be described.

FIGS. 14A to 14C are each a diagram illustrating a manufacturing process of a substrate bonding structure 106 according to the sixth preferred embodiment. FIG. 14A is a sectional view of a first substrate 1 and a second substrate 2 in a partially overlapped state. FIG. 14B is a sectional view of a substrate bonding structure in which a hole 3 is subsequently formed by irradiating a predetermined position in an overlapping portion 4 with a laser beam in the state illustrated in FIG. 14A. FIG. 14C is a sectional view of the substrate bonding structure in a state where an in-hole conductor 5 is subsequently formed in the hole 3 in the state illustrated in FIG. 14B.

Unlike the substrate bonding structure 105B illustrated in FIGS. 13A to 13C, the example illustrated in FIGS. 14A to 14C includes a ground conductor pattern 12G, a signal conductor pattern 12S, and a first resin substrate 11A, defining a first microstrip line. Similarly, a ground conductor pattern 22G, a signal conductor pattern 22S, and a second resin substrate 21A define a second microstrip line.

The example illustrated in FIGS. 14A to 14C includes a signal conductor pattern 22S (Cu foil) attached to a second resin substrate 21B, to which no browning treatment is applied. Other structures are the same or substantially the same as those of the substrate bonding structure 105B.

According to the structure of the substrate bonding structure 106, a laser beam is able to be reflected by the signal conductor pattern 22S, and energy injected into an interface between the first resin substrate and the second resin substrate is able to be increased. Accordingly, an area of the fused portion FP between the melted portion 13 of the first resin substrate and the melted portion 23 of the second resin substrate is able to be easily increased.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A substrate bonding structure comprising:
   a first substrate including a first resin substrate that melts by heating; and a second substrate including a second resin substrate that melts by heating and an overlapping portion with the first substrate; wherein the overlapping portion between the first substrate and the second substrate includes a plurality of holes that continuously extend from the first substrate to the second substrate;

the first substrate includes a melted portion of the first resin substrate around the plurality of holes;

the second substrate includes a melted portion of the second resin substrate around the plurality of holes;

the first substrate and the second substrate are bonded to each other with a fused portion between the melted portion of the first resin substrate and the melted portion of the second resin substrate;

the first substrate includes a first conductor pattern and the second substrate includes a second conductor pattern;

an inner surface of each of the plurality of holes includes an in-hole conductor;

the first conductor pattern of the first substrate and the second conductor pattern of the second substrate are electrically connected to each other by the in-hole conductor;

the plurality of holes include:
- a first hole that electrically connects the first conductor pattern of the first substrate and the second conductor pattern of the second substrate to each other by the in-hole conductor; and
- a second hole that does not electrically connect the first conductor pattern of the first substrate and the second conductor pattern of the second substrate to each other;

the second substrate includes a bent portion; and the second hole is located at a position closer to the bent portion than the first hole.

2. The substrate bonding structure according to claim 1, wherein a non-fused portion is provided in the overlapping portion between the first substrate and the second substrate.

3. The substrate bonding structure according to claim 2, wherein the non-fused portion is located farther from each of the plurality of holes than the fused portion is from the respective each of the plurality of holes.

4. The substrate bonding structure according to claim 1, wherein the first substrate and the second substrate are bonded to each other with the melted portions of the first resin substrate and the second resin substrate in a region of about 80% or more of an inner circumference of each of the plurality of holes.

5. The substrate bonding structure according to claim 4, wherein the fused portion has a thickness of about 0.02 mm or more and about 0.1 mm or less in a radial direction from a center of one of the plurality of holes.

6. The substrate bonding structure according to claim 1, wherein the in-hole conductor is filled inside each of the plurality of holes.

7. The substrate bonding structure according to claim 6, wherein the overlapping portion between the first substrate and the second substrate has a total thickness of about 0.5 mm or less; and the in-hole conductor has a thickness of about 0.01 mm or more in a radial direction from a center of a corresponding one of the plurality of holes.

8. The substrate bonding structure according to claim 6, wherein the overlapping portion between the first substrate and the second substrate has a total thickness of about 1.0 mm or more; and the in-hole conductor has a thickness of about 0.02 mm or more in a radial direction from a center of a corresponding one of the plurality of holes.

9. The substrate bonding structure according to claim 1, wherein at least one of the plurality of holes passes through the first substrate and does not pass through the second substrate.

10. The substrate bonding structure according to claim 1, wherein at least one of the plurality of holes has a tapered shape with a larger diameter in the first substrate than in the second substrate; and the melted portion of the first resin substrate has a larger volume than the melted portion of the second resin substrate.

11. The substrate bonding structure according to claim 10, wherein the first substrate has a thinner thickness than the second substrate.

12. The substrate bonding structure according to claim 1, wherein the first resin substrate and the second resin substrate are each made of a liquid crystal polymer;

each of the plurality of holes has a linear or substantially linear shape; and the melted portion of the second substrate has a higher melting point than the melted portion of the first substrate.

13. The substrate bonding structure according to claim 1, wherein the first resin and the second resin are each a laminate of a thermoplastic resin.

14. The substrate bonding structure according to claim 1, wherein the first substrate includes a first ground conductor pattern and the second substrate includes a second ground conductor pattern.

15. The substrate bonding structure according to claim 14, wherein the first ground conductor pattern and the second ground conductor pattern are not electrically connected to any of the plurality of holes.

16. The substrate bonding structure according to claim 1, wherein each of the first conductor pattern and the second conductor pattern is defined by a patterned Cu foil.

17. The substrate bonding structure according to claim 1, wherein a plurality of the first holes and a plurality of the second holes are included.

18. The substrate bonding structure according to claim 17, wherein the plurality of first holes are provided in a first row and the plurality of second holes are provided in a second row.

19. The substrate bonding structure according to claim 1, wherein at least a portion of the overlapping portion is irradiated by a $CO_2$ laser.

* * * * *